US008012780B2

(12) United States Patent
Yoshimoto et al.

(10) Patent No.: US 8,012,780 B2
(45) Date of Patent: Sep. 6, 2011

(54) METHOD OF FABRICATING SEMICONDUCTOR LASER

(75) Inventors: Susumu Yoshimoto, Itami (JP); Hideki Matsubara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 402 days.

(21) Appl. No.: 12/170,998

(22) Filed: Jul. 10, 2008

(65) Prior Publication Data

US 2009/0047751 A1 Feb. 19, 2009

(30) Foreign Application Priority Data

Aug. 13, 2007 (JP) ................................ P2007-210924

(51) Int. Cl.
*H01L 21/00* (2006.01)

(52) U.S. Cl. .............. 438/29; 438/32; 359/566; 372/99; 385/37

(58) Field of Classification Search .................... 438/29, 438/32; 359/566; 372/99; 385/37
See application file for complete search history.

(56) References Cited

U.S. PATENT DOCUMENTS

| 6,366,598 | B1 | 4/2002 | Nichols et al. | |
|---|---|---|---|---|
| 6,812,053 | B1 | 11/2004 | Kong et al. | |
| 6,826,223 | B1 * | 11/2004 | Meyer et al. | 372/96 |
| 7,768,023 | B2 * | 8/2010 | Diana et al. | 257/98 |
| 7,929,815 | B2 * | 4/2011 | Hofrichter et al. | 385/37 |
| 2003/0057444 | A1 | 3/2003 | Niki et al. | |
| 2004/0113166 | A1 | 6/2004 | Tadatomo et al. | |
| 2004/0218651 | A1 | 11/2004 | Iwasaki et al. | |
| 2004/0247009 | A1 | 12/2004 | Noda et al. | |
| 2004/0251519 | A1 | 12/2004 | Sugahara et al. | |
| 2004/0252741 | A1 * | 12/2004 | Meyer et al. | 372/67 |
| 2005/0249254 | A1 * | 11/2005 | Deppe | 372/46.01 |
| 2006/0024013 | A1 * | 2/2006 | Magnusson et al. | 385/129 |
| 2006/0147169 | A1 * | 7/2006 | Sugita et al. | 385/129 |
| 2006/0255341 | A1 | 11/2006 | Pinnington et al. | |
| 2007/0121694 | A1 | 5/2007 | Okamoto | |
| 2007/0170441 | A1 * | 7/2007 | Takizawa et al. | 257/79 |
| 2007/0280318 | A1 * | 12/2007 | Yoshimoto et al. | 372/43.01 |
| 2008/0080579 | A1 * | 4/2008 | Scherer | 372/45.011 |

(Continued)

FOREIGN PATENT DOCUMENTS

CN 1498427 A 5/2004

(Continued)

OTHER PUBLICATIONS

Meier et al., "Visible resonant modes in GaN-based photonic crystal membrane cavities," Applied Physics Letters, American Institute of Physics, 88(3), p. 031111-1-031111-3, Jan. 20, 2006.

(Continued)

*Primary Examiner* — Fernando L Toledo
(74) *Attorney, Agent, or Firm* — Venable LLP; Michael A. Sartori; Michael E. Nelson

(57) ABSTRACT

There is provided a method of fabricating a semiconductor laser including a two-dimensional photonic crystal. The method comprises the steps of growing an $In_{X1}Ga_{1-X1}N$ (0<X1<1) layer on a gallium nitride-based semiconductor region in a reactor; after taking out a substrate product including the $In_{X1}Ga_{1-X1}N$ layer from the reactor, forming a plurality of openings for a two-dimensional diffraction grating of the two-dimensional photonic crystal in the $In_{X1}Ga_{1-X1}N$ layer to form a patterned $In_{X1}Ga_{1-X1}N$ layer; and growing an $Al_{X2}Ga_{1-X2}N$ (0≦X2≦1) layer on a top surface of the patterned $In_{X1}Ga_{1-X1}N$ layer to form voids associated with the openings.

20 Claims, 9 Drawing Sheets

U.S. PATENT DOCUMENTS

2009/0225805 A1* 9/2009 Nagatomo ................ 372/99

FOREIGN PATENT DOCUMENTS

| CN | 1529915 A | 9/2004 |
|---|---|---|
| EP | 1411603 A1 | 4/2004 |
| JP | 57-130455 A | 8/1982 |
| JP | 10-284806 A | 10/1998 |
| JP | 11-186657 A | 7/1999 |
| JP | 2000-236137 A | 8/2000 |
| JP | 2000-332351 A | 11/2000 |
| JP | 2000-332353 A | 11/2000 |
| JP | 2003-023193 A | 1/2003 |
| JP | 2003-234502 A | 8/2003 |
| JP | 2003-237453 A | 8/2003 |
| JP | 2003-273456 A | 9/2003 |
| JP | 2004-111766 A | 4/2004 |
| JP | 2004-228122 A | 8/2004 |
| WO | WO-2004/064212 A1 | 7/2004 |
| WO | WO 2006/062084 A1 | 6/2006 |

OTHER PUBLICATIONS

Imada et al., "Coherent two-dimensional lasing action in surface-emitting laser with triangular lattice photonic crystal structure," Applied Physics Letters, vol. 75, No. 3, pp. 316-318, 1999.

Tokuda et al., "Wafer Fusion Technique Applied to GaN/GaN System," Jpn. J. Appl. Phys., vol. 39, Part 2 (6B), pp. L572-L574, 2000.

Yokoyama et al., "Surface-Emitting Two-Dimensional Photonic Crystal Lasers," J. Jpn. Soc. Infrared Science & Tech., vol. 12, No. 2, pp. 17-23, 2003.

* cited by examiner (a)

(b)

(c)

(a)

(b)

(c)

(a)

(b)

(a)

(b)

(c)

(a)

(b)

(c)

(a)

(b)

(a)

(b)

(a)

(b)

METHOD OF FABRICATING SEMICONDUCTOR LASER

BACKGROUND OF THE INVENTION

1. Field of the Invention

The present invention relates to a method of fabricating a semiconductor laser.

2. Related Background Art

Patent Document 1 (International Publication No. 2006/062084) discloses a semiconductor laser. The semiconductor laser comprises an active layer sandwiched between a p-type cladding layer and an n-type cladding layer, and a photonic crystal layer is provided on the p-type cladding layer. The photonic crystal layer comprises a GaN epitaxial layer and portions made of a material having a smaller refractive index than that of GaN, and another GaN layer is formed over the photonic crystal layer.

SUMMARY OF THE INVENTION

The photonic crystal layer of the semiconductor laser described in Patent Document 1 comprises the GaN epitaxial layer and an arrangement of portions made of a material of a smaller refractive index than that of GaN, and these portions are buried in a gallium nitride-based semiconductor region. On the other hand, if a photonic crystal structure can be made by forming an arrangement of voids without using a material having a smaller refractive index than that of GaN, this type of the photonic crystal structure has a large refractive index difference. In the formation of the photonic crystal structure, a GaN layer is patterned to form an array of holes. A gallium nitride-based semiconductor is grown over the patterned GaN layer, and depositions, however, grow also within the holes. These depositions may deform some of the holes, thereby degrading the uniformity of the arrangement of voids.

It is an object of the present invention to provide a method of fabricating a semiconductor laser including a photonic crystal structure having an arrangement of voids.

According to one aspect of the present invention, there is provided a method of fabricating a semiconductor laser including a two-dimensional photonic crystal. The method comprises the steps of (a) growing, in a reactor, an $In_{X1}Ga_{1-X1}N$ ($0<X1<1$) layer on a gallium nitride-based semiconductor region; (b) after taking out a substrate product including the $In_{X1}Ga_{1-X1}N$ layer from the reactor, forming a plurality of openings for a two-dimensional diffraction grating of the two-dimensional photonic crystal in the $In_{X1}Ga_{1-X1}N$ layer to form a patterned $In_{X1}Ga_{1-X1}N$ layer; and (c) growing an $Al_{X2}Ga_{1-X2}N$ ($0\leq X2\leq 1$) layer on the top surface of the patterned $In_{X1}Ga_{1-X1}N$ layer to form voids. The voids are associated with the openings.

In the method of fabricating a semiconductor laser according to the above aspect of the present invention, it is preferable that the side surface and bottom surface of each opening be made of InGaN.

In the method of fabricating a semiconductor laser according to the above aspect of the present invention, it is preferable that the method further comprises the step of, after growing the $In_{X1}Ga_{1-X1}N$ layer and prior to forming the plurality of the openings for the two-dimensional diffraction grating in the $In_{X1}Ga_{1-X1}N$ layer, forming a GaN layer on the $In_{X1}Ga_{1-X1}N$ layer. The substrate product includes the GaN layer, and the openings are formed in the $In_{X1}Ga_{1-X1}N$ layer and the GaN layer.

In the method of fabricating a semiconductor laser according to the above aspect of the present invention, it is preferable that the method comprises the step of, prior to the formation of the $Al_{X2}Ga_{1-X2}N$ layer, forming a dielectric layer, The dielectric layer covers the bottom surfaces of the openings, and the substrate product includes the dielectric layer.

In the method of fabricating a semiconductor laser according to the above aspect of the present invention, it is preferable that the dielectric layer includes at least one of a silicon oxide layer, a silicon oxynitride layer, a silicon nitride layer, a zirconium oxide layer, a titanium oxide layer, and a hafnium oxide layer.

In the method of fabricating a semiconductor laser according to the above aspect of the present invention, it is preferable that the method further comprises the step of, after growing the $Al_{X2}Ga_{1-X2}N$ layer, growing an active layer.

In the method of fabricating a semiconductor laser according to the above aspect of the present invention, it is preferable that the method further comprises the step of, prior to growing the $In_{X1}Ga_{1-X1}N$ layer, growing an active layer.

In the method of fabricating a semiconductor laser according to the above aspect of the present invention, it is preferable that the top surface of the $In_{X1}Ga_{1-X1}N$ layer be in contact with the $Al_{X2}Ga_{1-X2}N$ layer. Further, it is preferable that the $Al_{X2}Ga_{1-X2}N$ layer be grown on the $In_{X1}Ga_{1-X1}N$ layer such that the $Al_{X2}Ga_{1-X2}N$ layer closes the openings to form the voids. Furthermore, it is preferable that the $In_{X1}Ga_{1-X1}N$ layer be covered with the $Al_{X2}Ga_{1-X2}N$ layer without filling the openings to form the voids. Additionally, it is preferable that the $Al_{X2}Ga_{1-X2}N$ layer be a GaN layer.

In the method of fabricating a semiconductor laser according to the above aspect of the present invention, it is preferable that the voids be arranged in a triangle grating or a square grating.

BRIEF DESCRIPTION OF THE DRAWINGS

The above-described and other objects, features and advantages of the present invention will be more easily understood based on the following detailed description of preferred embodiments of the present invention with reference to the accompanied drawings.

DESCRIPTION OF THE PREFERRED EMBODIMENTS

The teaching of the present invention can be more easily understood based on the following detailed description with reference to the accompanied drawings illustrated as an example. Referring to the accompanying drawings, embodiments of a method of fabricating a semiconductor laser of the present invention will be explained. When possible, parts identical to each other will be referred to with symbols identical to each other.

Figure 1:
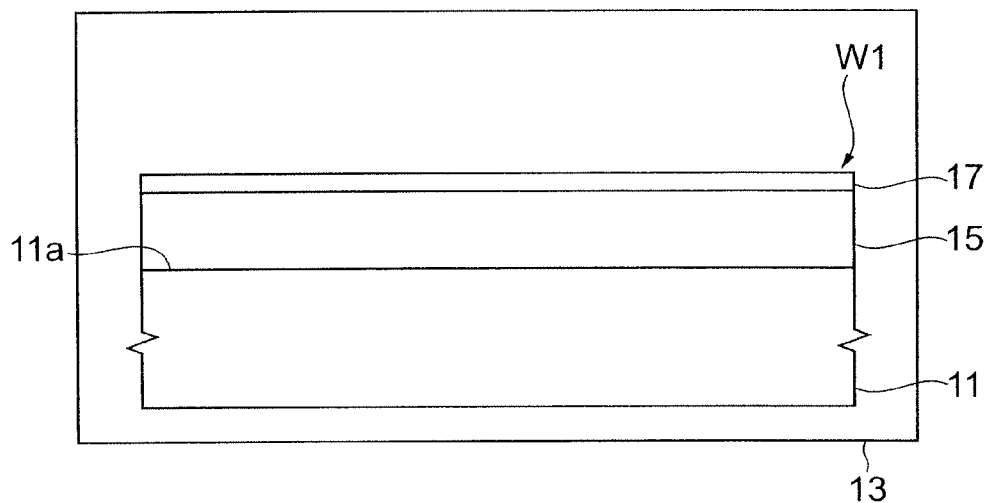
FIG. 1 is a diagram showing primary steps in a method of fabricating a semiconductor laser including a two-dimensional photonic crystal according to a preferred embodiment of the present invention.
Figure 1:
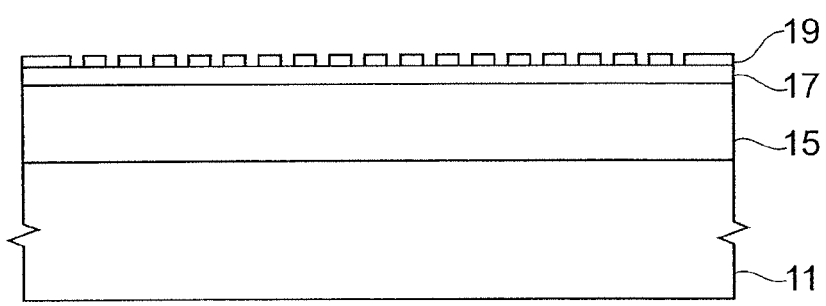
Figure 1:
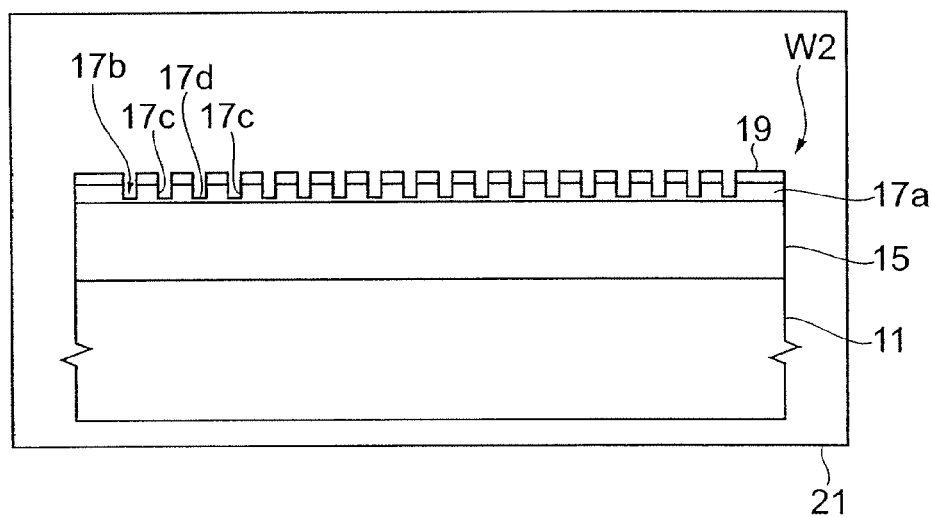
Figure 2:
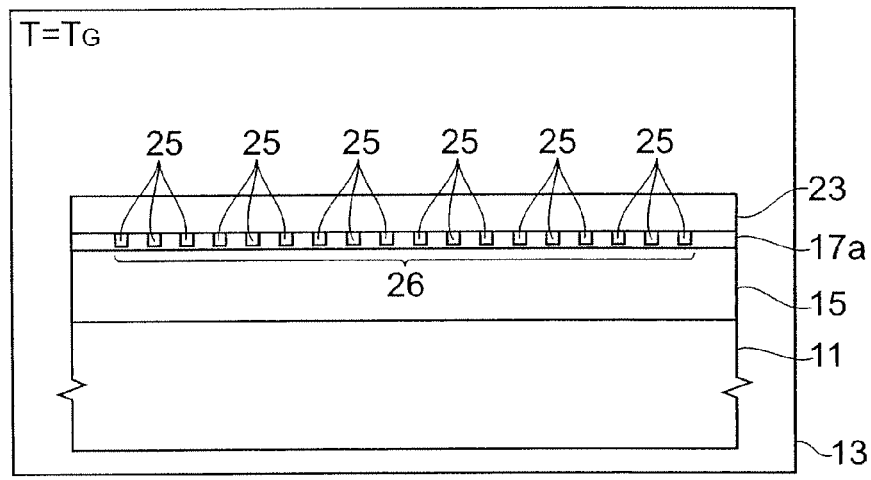
FIG. 2 is a diagram showing primary steps in a method of fabricating a semiconductor laser including a two-dimensional photonic crystal according to a preferred embodiment of the present invention.
Figure 2:
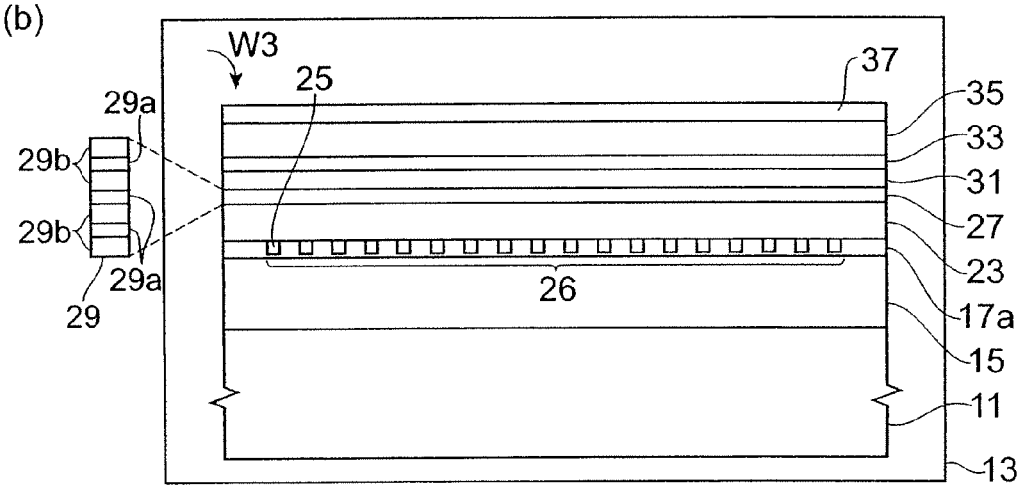
Figure 2:
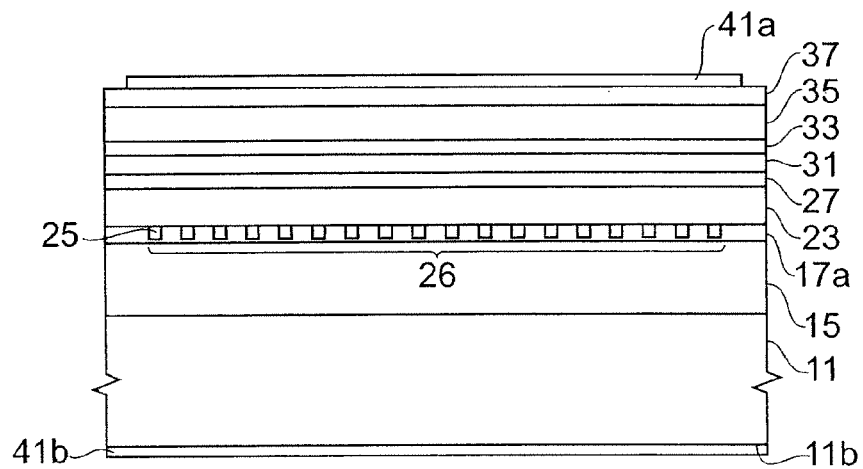

FIGS. 1 and 2 are diagrams showing primary steps of a method of fabricating a semiconductor laser including a two-dimensional photonic crystal according to a preferred embodiment of the present invention. In the present embodiment, a number of gallium nitride-based semiconductor layers for the semiconductor laser are formed, for example, through metal organic vapor phase epitaxy.

As shown in Part (a) of FIG. 1, a substrate 11, such as a GaN substrate, is loaded to a reactor 13. In the following exemplary description, steps for forming the semiconductor laser are applied on the substrate 11 of an n-type conductivity. After performing a thermal cleaning process of the primary surface 11a of the substrate 11, an n-type cladding layer 15 is grown thereon. The n-type cladding layer 15 can be made of, for example, a gallium nitride-based semiconductor, such as AlGaN. On the n-type cladding layer 15, an $In_{X1}Ga_{1-X1}N$ (0<X1<1) layer (hereinafter referred to as "InGaN layer") 17 is grown. The InGaN layer 17 is doped with, for example, an n-type dopant, and has a larger refractive index than that of the n-type cladding layer 15. After growing the InGaN layer 17, the temperature of the reactor is lowered to a temperature near room temperature, and a substrate "W1" is taken out from the reactor 13.

The subsequent steps will be described below. The next step comprises patterning the InGaN layer 17 of the substrate "W1" for forming a plurality of openings for use in a two-dimensional diffraction grating in a two-dimensional photonic crystal, to form a patterned InGaN layer. As shown in Part (b) of FIG. 1, a mask 19 for the two-dimensional diffraction grating is formed on the InGaN layer 17 of the substrate "W1." The mask 19 has an arrangement of openings for forming the two-dimensional diffraction grating, and these openings may be arranged in a grating such as triangle grating and square grating. The mask 19 can be made of, for example, resist, and an electron beam can be scanned on a photoresist film to draw a pattern for forming openings for the two-dimensional diffraction grating, and the exposed photoresist film is developed to form the mask 19.

By use of this mask 19, openings for the two-dimensional diffraction grating are formed in the InGaN layer 17. This formation is performed by processing, such as etching. As shown in Part (c) of FIG. 1, for example, the InGaN layer 17 is etched using the mask 19 in a dry etching apparatus 21 to form an InGaN layer 17a having the periodic distribution of refractive index. The InGaN layer 17a includes openings 17b, for example holes, and the arrangement of the openings 17b corresponds to the pattern of the mask 19. The side surface 17c and bottom surface 17d of each opening 17b are made of InGaN. After the etching, the mask 19 is removed to provide a substrate "W2." The substrate "W2" includes the patterned InGaN layer 17a. The depth of the openings 17b is, for example, preferably 20 nanometers or greater. When the openings are too shallow, the optical coupling between the photonic crystal and the active layer is made weak and sufficient feedback effect through the photonic crystal cannot be obtained. The period of the arrangement of the openings 17b is determined by the wavelength of an optical emission and the refractive index of the gallium nitride-based semiconductor that forms the two-dimensional diffraction grating.

The substrate "W2" is placed in the reactor 13, and the temperature of the reactor 13 is raised to a growth temperature "$T_G$." Then, as shown in Part (a) of FIG. 2, a gallium nitride-based semiconductor layer 23 is formed on the InGaN layer 17a. The gallium nitride-based semiconductor layer 23 is, for example, an n-type GaN layer. The gallium nitride-based semiconductor layer 23 is laterally grown on the InGaN layer 17a so that this layer can be grown over the openings without filling them, covering the openings to form the voids. As a result, the layer is grown so as to close the openings 17b, thereby forming voids 25. Alternatively, an AlGaN layer may be grown in place of the GaN layer.

In this method, after the substrate "W2" is loaded to the reactor 13, the temperature of the substrate "W2" is raised in the reactor toward the growth temperature "$T_G$." In this rise in temperature, the openings 17b of the patterned InGaN layer 17a is affected so as to restrict the growth of $Al_{X2}Ga_{1-X2}N$ and migration in the openings 17b as compared with the surface of $In_{X1}Ga_{1-X1}N$. As a result, $Al_{X2}Ga_{1-X2}N$ is grown on the top surface of the InGaN layer 17a over the openings of the $In_{X1}Ga_{1-X1}N$ layer 17a to cover openings without filling them, so that voids 25 are formed by combining the opening 17b and the $Al_{X2}Ga_{1-X2}N$ layer with each other. The above processes form a two-dimensional diffraction grating 26 of the two-dimensional photonic crystal.

In the next process, a number of gallium nitride-based semiconductor layers are grown using the reactor 13. As shown in Part (b) of FIG. 2, an active layer 27 is grown on the gallium nitride-based semiconductor layer 23. The active layer 27 is optically coupled with the two-dimensional diffraction grating 26. For example, the active layer 27 has a quantum well structure 29, but the structure of the active layer 27 is not limited to this structure. The quantum well structure 29 includes well layers 29a and barrier layers 29b alternately arranged. The well layers 29a may be made of, for example, InGaN, AlGaN, GaN or InAlGaN, and the barrier layers 29b may be made of material, such as InGaN, GaN, AlGaN or InAlGaN, having a bandgap larger than the well layers 29a.

Then, a gallium nitride-based semiconductor layer 31 is grown on the active layer 27. The gallium nitride-based semiconductor layer 31 is, for example, a GaN layer, and preferably is made of an undoped layer in order to avoid absorption of light by dopant atoms contained therein.

An electron blocking layer 33, a p-type cladding layer 35 and a p-type contact layer 37 are grown sequentially on the gallium nitride-based semiconductor layer 31. The electron blocking layer 33 may be made of, for example, an AlGaN layer having a larger bandgap than the gallium nitride-based semiconductor layer 31, and preferably is doped with a p-type dopant. The p-type cladding layer 35 supplies holes to the active layer 25, and is made of a gallium nitride-based semiconductor of a smaller refractive index than that of the active layer 25 in order to confine light thereto. The p-type cladding layer 35 may be made of, for example, an AlGaN layer. The p-type contact layer 37 preferably is heavily doped with a dopant in order to provide an excellent electrical connection. The p-type contact layer 37 may be made of, for example, a p-type GaN layer or a p-type AlGaN layer. After the growth of these layers, a substrate "W3" is provided.

The back side of the substrate 11 may be ground. As shown in Part (c) of FIG. 2, a p-side electrode 41a is formed on the p-type contact layer 37, and an n-side electrode 41b is formed on a backside 11b of the substrate 11.

EXAMPLE 1

A two-dimensional photonic crystal (n-side) violet semiconductor laser was fabricated through metal organic vapor phase epitaxy. Trimethyl gallium (TMG), trimethyl indium (TMI), trimethyl aluminum (TMA), ammonia ($NH_3$), monosilane ($SiH_4$), and bis-cyclopentadienyl magnesium ($Cp_2Mg$) were used as raw materials. After a (0001)-face n-type gallium nitride substrate is placed on a susceptor, and $NH_3$ and $H_2$ were supplied to the reactor to apply a thermal cleaning process to the substrate for 10 minutes at a substrate temperature of 1100 degrees Celsius and a chamber pressure of 30 kPa. After the chamber pressure was controlled to atmospheric pressure, a number of films were formed in the following order. First, TMG, TMA, $NH_3$ and $SiH_4$ were supplied to the reactor to grow n-type $Al_{0.03}Ga_{0.97}N$ with a thickness of 2 micrometers (μm) at a substrate temperature of 1100 degrees Celsius. Then, TMG, TMI, TMA, $NH_3$ and $SiH_4$ were supplied to grow n-type $In_{0.02}Ga_{0.98}N$ for the diffraction grating at a substrate temperature of 880 degrees Celsius and the thickness of the $In_{0.02}Ga_{0.98}N$ film is 100 nanometers (nm). As a result of the formation of these layers, an epitaxial wafer is provided. After lowering the temperature of the substrate, the epitaxial wafer was taken out from the reactor. A mask for photonic crystal was formed in the following manner. A photoresist for electron beam exposure was applied to the epitaxial wafer using a spin coater to form a uniform resist film. By use of an electron beam exposing apparatus, a number of patterns for photonic crystal were drawn in the resist film, and each pattern is formed in 300×300 sq. micrometer area of the resist film and has a number of exposed dots, arranged in a pitch of 166 nm, each of which has a diameter of 70 nm. After the resist film was developed to form the mask, the epitaxial wafer was loaded to a reactive ion etching (RIE) apparatus. The n-type InGaN layer was partially removed using the etchant of $Cl_2$, so that the patterns of the resist mask are transferred to form the patterned InGaN layer, which has an arrangement of openings associated with each pattern. After this process, the resist mask was removed from the wafer for the subsequent crystal growth.

After the wafer was loaded to the susceptor, the substrate temperature was raised to the growth temperature. TMG, $NH_3$, and $SiH_4$ were supplied to the reactor at the substrate temperature of 1100 degrees Celsius and the chamber pressure of 30 kPa, an n-type GaN layer was grown over InGaN layer with a thickness of 200 nanometers (nm) to form an arrangement of voids corresponding to the depressions of the InGaN layer. Then, the temperature of the reactor was lowered in order to an active layer having a quantum well structure with three well layers. TMG, TMI and $NH_3$ were supplied to the reactor at a substrate temperature of 880 degrees Celsius to grow an undoped $In_{0.01}Ga_{0.99}N$ barrier layer with a thickness of 15 nanometers (nm). TMG, TMI and $NH_3$ were supplied to the reactor at a substrate temperature of 800 degrees Celsius to form an undoped $In_{0.07}Ga_{0.93}N$ well layer with a thickness of 3 nanometers (nm). Then, the temperature of the reactor was raised, and TMG and NH3 were supplied to the reactor at a growth temperature of 1100 degrees Celsius to form an undoped GaN layer with a thickness of 50 nanometers (nm). TMG, TMA, $NH_3$ and $Cp_2Mg$ were supplied to the reactor to form a p-type $Al_{0.12}Ga_{0.88}N$ electron blocking layer with a thickness of 20 nanometers (nm). TMG, TMA, $NH_3$ and $Cp_2Mg$ were supplied to the reactor to grow a p-type $Al_{0.07}Ga_{0.93}N$ cladding layer with a thickness of 600 nanometers (nm). TMG, $NH_3$ and $Cp_2Mg$ were supplied to the reactor to form a p-type GaN contact layer with a thickness of 50 nanometers (nm). After the growth of these layers, the epitaxial wafer "E1" was taken out from the reactor, and an anode electrode made of Ni/Au was formed on the p-type GaN layer. After back-grinding the GaN substrate to a thickness of 100 micrometers (μm), and a cathode electrode was formed on the backside of the substrate.

After forming the electrodes, the substrate was cut to form violet two-dimensional photonic crystal semiconductor laser chips of 1 sq. mm, each including the photonic crystal structure of 300 μm×300 μm. When a pulsed current (with a frequency of 1 kHz and a pulse width of 500 nanoseconds) was applied to the violet two-dimensional photonic crystal semiconductor laser chip at room temperature, lasing oscillation at a wavelength of 405 nanometers (nm) was observed.

An epitaxial wafer "R1" was prepared as a referential example by growing an n-type GaN layer of a thickness of 100 nanometers (nm) for the diffraction grating in place of the n-type $In_{0.02}Ga_{0.98}N$ layer of the thickness of 100 nanometers (nm).

Figure 3:
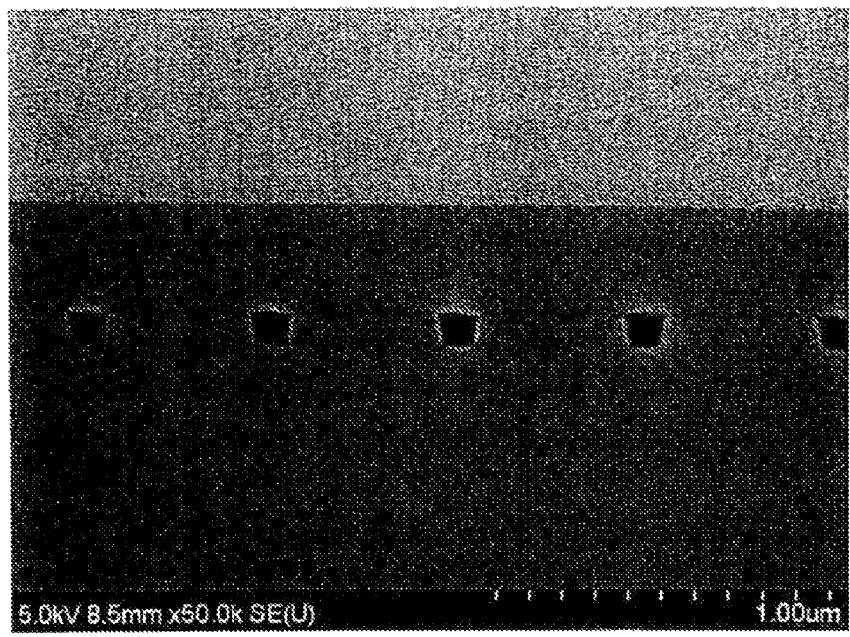
FIG. 3 is a diagram showing the SEM photograph of an arrangement of voids in the example and the SEM photograph of an arrangement of voids in a referential example.
Figure 3:
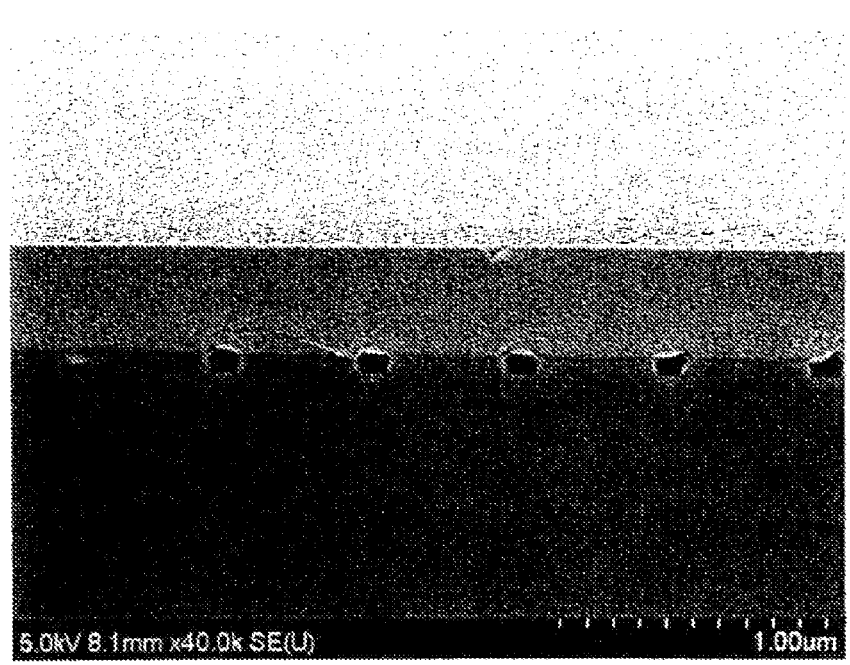

We observed cross sectional views of the epitaxial wafers "E1" and "R1" using a scanning electron microscope (SEM). Part (a) of FIG. 3 is a diagram of a SEM image showing the arrangement of the voids in the example. With reference to Part (a) of FIG. 3, the shapes of these voids were excellent. Part (a) of FIG. 3 is a diagram of a SEM image showing the arrangement of the voids in the referential example. With reference to Part (a) of FIG. 3, the shapes of some of voids among these voids were deformed because of lateral growth in the voids.

Figure 4:
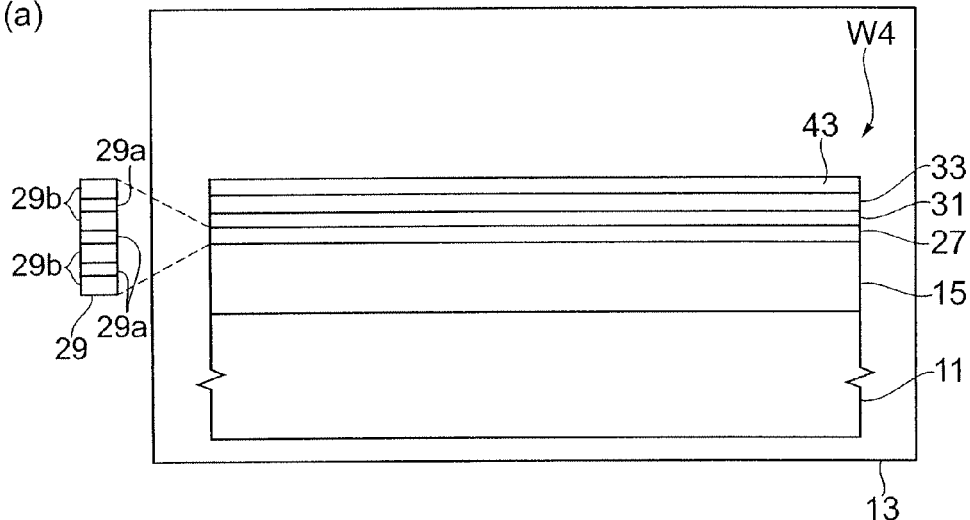
FIG. 4 is a diagram showing primary steps in a method of fabricating a semiconductor laser including a two-dimensional photonic crystal according to a modified embodiment of the present invention.
Figure 4:
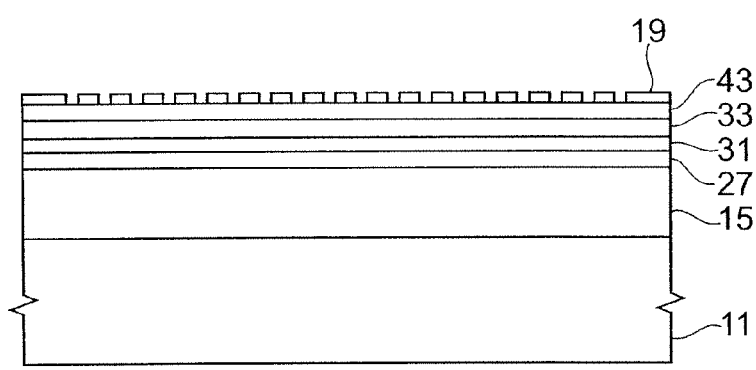
Figure 4:
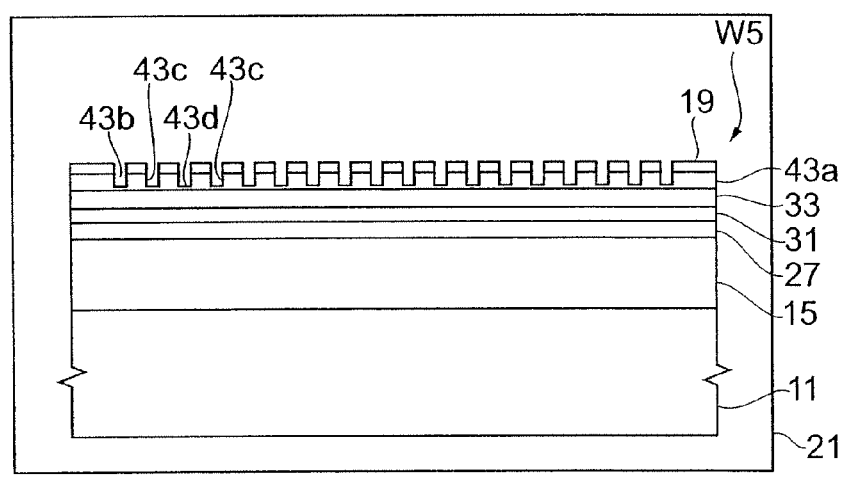
Figure 5:
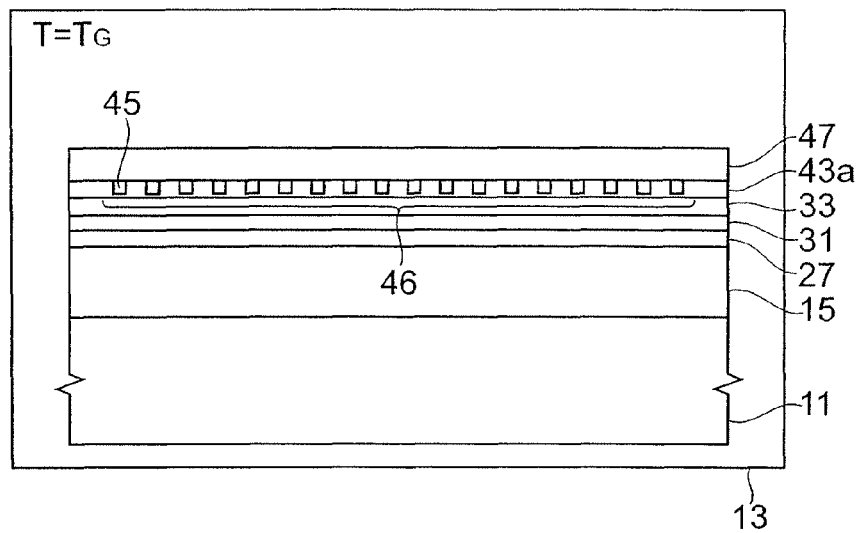
FIG. 5 is a diagram showing primary steps in a method of fabricating a semiconductor laser including a two-dimensional photonic crystal according to the modified embodiment of the present invention.
Figure 5:
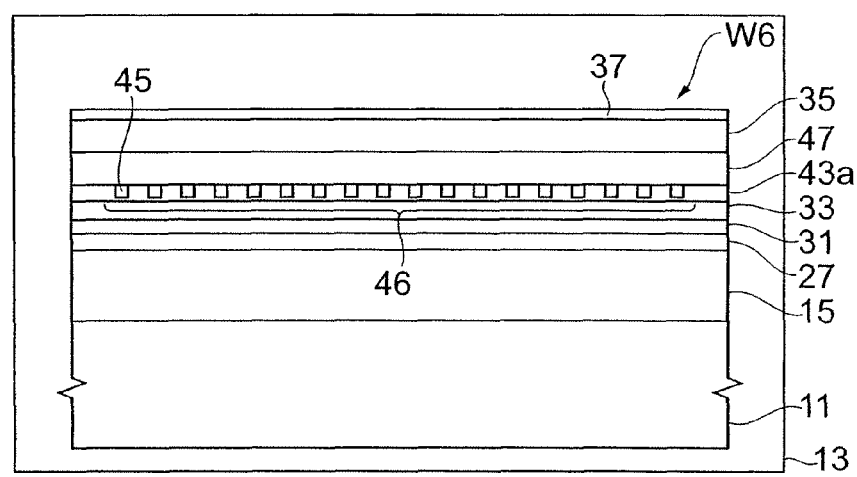
Figure 5:
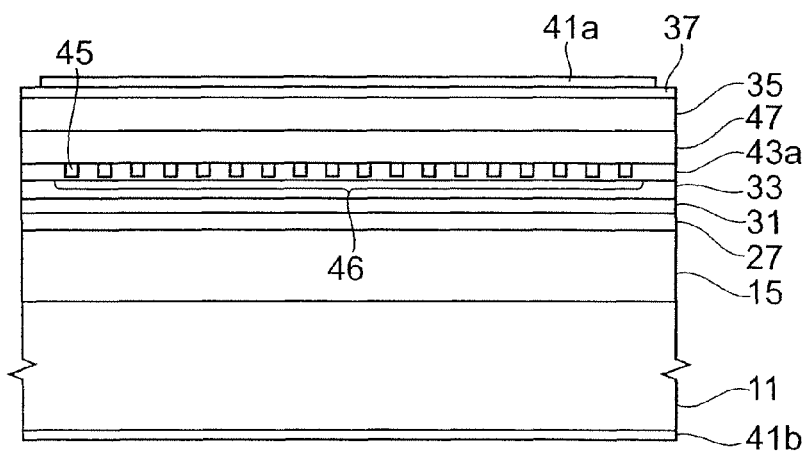

FIGS. 4 and 5 are diagrams showing primary steps of a method of fabricating a semiconductor laser including a two-dimensional photonic crystal according to another preferred embodiment of the present invention. In this embodiment, a structure for the two-dimensional photonic crystal is formed after growing the active layer. Similar to the above-described embodiment, a number of gallium nitride-based semiconductor layers for the semiconductor laser are formed through, for example, metal organic vapor phase epitaxy.

After loading the substrate 11, such as a GaN substrate, to the reactor 13, a thermal cleaning process is applied to the primary surface 11a of the substrate 11, and the n-type cladding layer 15 is grown thereon as shown in Part (b) of FIG. 4. The n-type cladding layer 15 comprises, for example, an AlGaN layer. Then, by use of the reactor 13, a number of gallium nitride-based semiconductor layers are grown on the n-type cladding layer 15. In the present embodiment, the active layer 27 is grown on the n-type cladding layer 15. Alternatively, an active layer of another structure may be grown thereon in place of the active layer 27. The gallium nitride-based semiconductor layer 31 is formed on the active layer 27. The gallium nitride-based semiconductor layer 31 may be, for example, a GaN layer, and preferably is undoped, thereby avoiding absorption of light by dopant. The electron blocking layer 33 is grown above the gallium nitride-based semiconductor layer 31. Then, an n-type gallium nitride-based semiconductor layer 43 is grown on the electron blocking layer 33. An $In_{X1}Ga_{1-X1}N$ (0<X1<1) layer (hereinafter referred to as InGaN layer) 43 is doped with, for example, an n-type dopant, and has a refractive index larger than that of the cladding layer. After growing the InGaN layer 43, the temperature of the reactor 13 is lowered to a temperature near the room temperature, and a substrate "W4" is taken out from the reactor 13.

The next step will be described below. In this step, the InGaN layer 43 on the substrate "W4" is patterned to form the patterned InGaN layer having a plurality of openings for the two-dimensional diffraction grating of the photonic crystal. As shown in Part (b) of FIG. 4, similar to the above-described embodiment, a mask 19 for the two-dimensional diffraction grating is formed on the InGaN layer 43 of the substrate "W4."

The mask 19 is used to form openings for the two-dimensional diffraction grating in the InGaN layer 43. This formation is carried out by etching method. As shown in Part (c) of FIG. 4, for example, the InGaN layer 43 is etched through a dry etcher 21 using the mask 19 to form a patterned InGaN layer 43a. The InGaN layer 43a has the arrangement of openings 43b that corresponds to the pattern of the mask 19. The side surface 43c and bottom surface 43d of each opening 43b are made of InGaN. After the etching, the mask 19 is removed to provide a substrate "W5." The substrate "W5" includes the patterned InGaN layer 43a. In an example, it is preferable that the depth of the openings 43b be, for example, 20 nm or more. When the bottom of the openings is too shallow, the optical coupling between the photonic crystal and the active layer is made small, so that the sufficient feedback effect cannot be obtained. As already described, the period of the arrangement of the openings 43b is determined based on both the refractive index of gallium nitride-based semiconductor for the two-dimensional diffraction grating and the wavelength of light that is to be emitted.

The substrate "W5" is loaded to the reactor 13, and the temperature of the reactor 13 is raised to the growth temperature "$T_G$." Then, as shown in Part (a) of FIG. 5, a gallium nitride-based semiconductor layer 47 is formed on the InGaN layer 43a. The gallium nitride-based semiconductor layer 47 is, for example, a p-type GaN layer. The gallium nitride-based semiconductor layer 47 is laterally grown on the InGaN layer 43a without filling them, covering the openings to form an extension over the openings. Therefore, the gallium nitride-based semiconductor layer 47 is grown in a manner to form voids 45 associated with the openings 43b. Alternatively, an AlGaN layer may be grown in place of the GaN layer. Accordingly, the gallium nitride-based semiconductor layer 47 can be represented as $Al_{X2}Ga_{1-X2}N$ ($0 \leq X2 \leq 1$).

In this method, the temperature of the substrate "W5" is raised in the reactor toward the growth temperature "$T_G$." In this temperature rise, the openings 43b of the patterned InGaN layer 43a are affected so as to suppress the growth of $Al_{X2}Ga_{1-X2}N$ and the occurrence of migration in the openings 43b as compared with the top surface of the patterned $In_{X1}Ga_{1-X1}N$ layer. As the result of growing the $Al_{X2}Ga_{1-X2}N$ layer, the voids 45 are formed by the openings 43b and the $Al_{X2}Ga_{1-X2}N$ layer that closes the openings 43b, so that a two-dimensional diffraction grating 46 of the two-dimensional photonic crystal has been formed by use of the above process. The two-dimensional diffraction grating 46 is optically coupled with the active layer 27.

Subsequently, the p-type cladding layer 35 is grown on the gallium nitride-based semiconductor layer 47 using the reactor 13, and the p-type contact layer 37 is grown thereon. It is preferable that the dopant concentration of the p-type contact layer 37 be made heavy in order to form an excellent electric contact. The p-type contact layer 37 may be made of, for example, a p-type GaN layer. After the growth of these layers, a substrate "W6" is provided.

As shown in Part (c) of FIG. 5, if required, the substrate 11 is back-ground. The p-side electrode 41a is formed on the p-type contact layer 37, and the n-side electrode 41b is formed on the backside 11b of the substrate 11.

EXAMPLE 2

Similar to Example 1, a violet two-dimensional photonic crystal (p-side) laser was fabricated by metal organic vapor phase epitaxy. After a (0001)-face n-type gallium nitride substrate was placed on the susceptor, a thermal cleaning process was applied to the substrate as in Example 1. After the pressure of the reactor was controlled to atmospheric pressure, semiconductor films were formed in the following order. First, TMG, TMA, $NH_3$ and $SiH_4$ were supplied to the reactor to grow an n-type $Al_{0.03}Ga_{0.97}N$ with a thickness of 2 micrometers (μm). The temperature in the reactor was lowered, and an active layer having a quantum well structure of three periods was formed thereon. At a substrate temperature of 880 degrees Celsius, TMG, TMI, and $NH_3$ were supplied to the reactor to grow an undoped $In_{0.01}Ga_{0.99}N$ barrier layer with a thickness of 15 nm. At a substrate temperature of 800 degrees Celsius, TMG, TMI and $NH_3$ were supplied to the reactor to grow an undoped $In_{0.07}Ga_{0.93}N$ well layer with a thickness of 3 nanometers (nm). Then, the temperature of the reactor was raised to a growth temperature of 1100 degrees Celsius, and TMG and $NH_3$ were supplied to the reactor to form an undoped GaN layer with a thickness of 50 nm. TMG, TMA, $NH_3$ and $Cp_2Mg$ were supplied to the reactor to grow an electron blocking layer of p-type $Al_{0.12}Ga_{0.88}N$ with a thickness of 20 nm. Then, at a substrate temperature of 880 degrees Celsius, TMG, TMI, TMA, $NH_3$ and $Cp_2Mg$ were supplied to the reactor to grow a p-type $In_{0.02}Ga_{0.98}N$ layer with a thickness of 100 nm for the diffraction grating. As a result of the above steps, an epitaxial wafer was obtained.

The epitaxial wafer was taken out from the reactor, and a mask for the photonic crystal was formed thereon in a following manner. A photoresist for electron beam exposure was applied to the surface of the wafer using a spin coater to form a uniform resist film. By use of an electron beam exposing apparatus, a square lattice pattern for photonic crystal was drawn within a resist film area of a 300×300 sq. micrometers, and the drawn pattern includes EB-exposed dots each of which has a diameter of 70 nm and which are arranged in the pitch of 166 nanometers (nm). After developing the resist film to form the mask, the wafer was loaded to a reactive ion etching apparatus. By use of the resist mask, the n-type InGaN layer was partially removed using an etching gas of $Cl_2$ for transferring the square lattice pattern to the InGaN layer to form an InGaN layer having openings arranged in the square lattice. Then, the resist mask was removed from the wafer for subsequent crystal growth.

After the wafer was placed on the susceptor, the substrate temperature was raised to the growth temperature. TMG, $NH_3$ and $Cp_2Mg$ were supplied to the reactor at the substrate temperature of 1100 degrees Celsius and the chamber pressure of 30 kPa to grow a p-type GaN layer with a thickness of 200 nm, thereby forming an arrangement of voids corresponding to the depressions in the InGaN layer. Then, TMG, TMA, $NH_3$ and $Cp_2Mg$ were supplied to form a p-type $Al_{0.07}Ga_{0.93}N$ cladding layer with a thickness of 600 nm. TMG, $NH_3$ and $Cp_2Mg$ were supplied to grow a p-type GaN contact layer with a thickness of 50 nm. After growing these layers to form an epitaxial wafer "E1," this epitaxial wafer "E1" was taken out from the reactor. An anode electrode of Ni/Au was formed on the p-type GaN layer in the epitaxial wafer "E1." After the GaN substrate was back-ground to a thickness of 100 micrometers (μm), a cathode electrode was formed on the backside of the substrate to form a substrate product.

The substrate product was cut to form a chip of 1 mm×1 mm including the photonic crystal pattern of 300 μm×300 μm. When a pulsed current (with a frequency of 1 kHz and a pulse width of 500 nanoseconds) was applied to the violet two-dimensional photonic crystal laser at room temperature, lasing oscillation at a lasing wavelength of 405 nanometers was observed.

Figure 6:
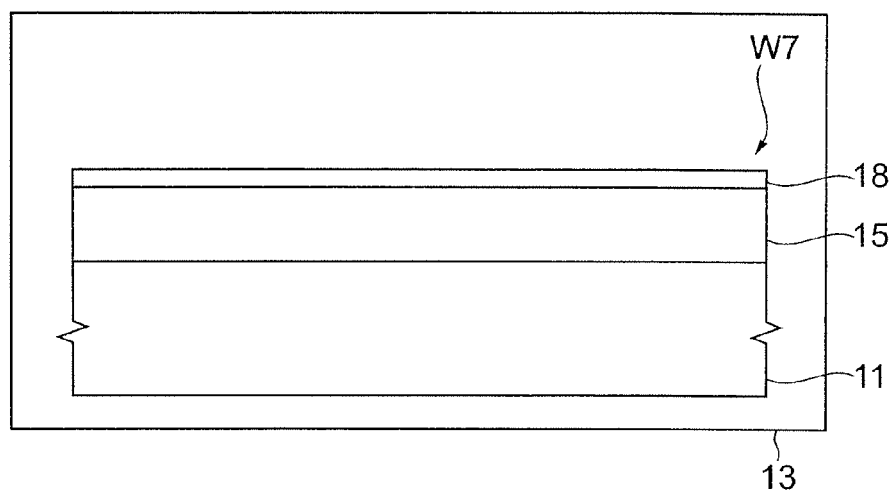
FIG. 6 is a diagram showing primary steps in a method of fabricating a semiconductor laser including a two-dimensional photonic crystal according to another modified embodiment of the present invention.
Figure 6:
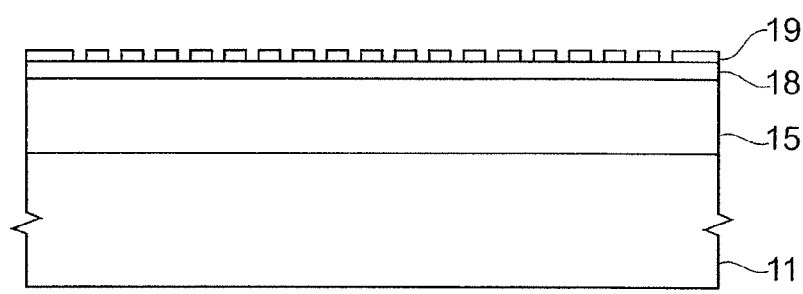
Figure 6:
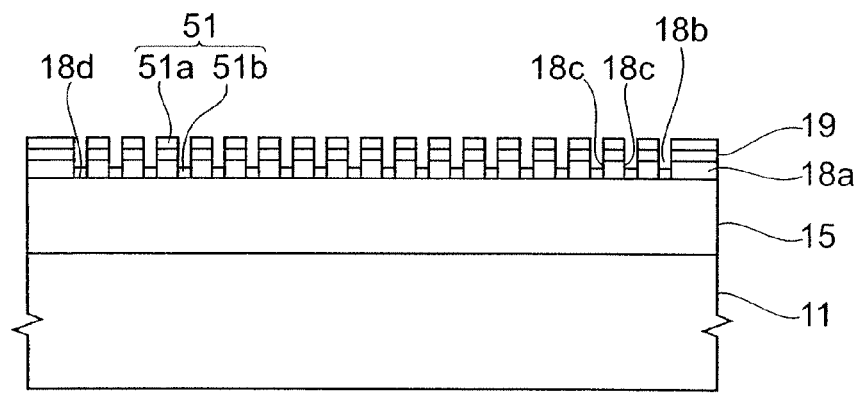
Figure 7:
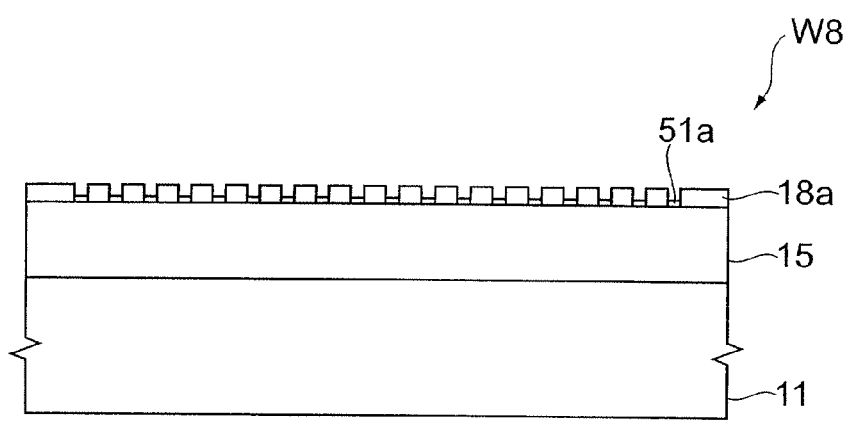
FIG. 7 is a diagram showing primary steps in a method of fabricating a semiconductor laser including a two-dimensional photonic crystal according to the other the modified embodiment of the present invention.
Figure 7:
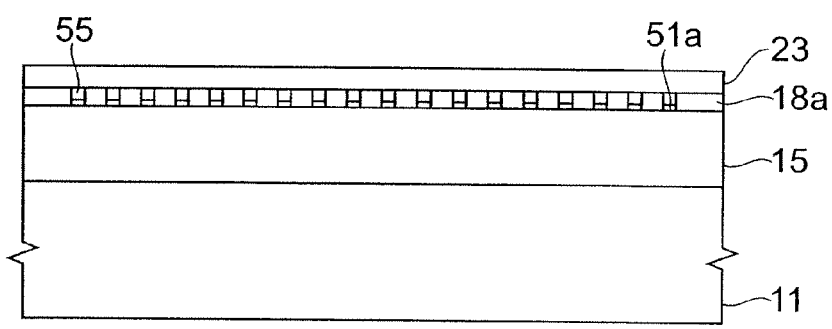

FIGS. 6 and 7 show primary steps of a method of fabricating a semiconductor laser including a two-dimensional photonic crystal according to another modified embodiment of the present invention. In this embodiment, after forming the openings in the InGaN layer, dielectric material is deposited at the bottoms of the openings. After this deposition, a structure for the two-dimensional photonic crystal is formed. A number of gallium nitride-based semiconductor layers for the semiconductor layer are formed through, for example, metal organic vapor phase epitaxy as in the above-described embodiments.

As shown in Part (a) of FIG. 6, the substrate 11, such as a GaN substrate, is loaded to the reactor 13. In the following description, the substrate 11 of, for example, n-type conductivity is used, and steps for fabricating the semiconductor laser are applied to this substrate. After performing a thermal cleaning of the primary surface 11a of the substrate 11, the n-type cladding layer 15 and an $In_{X1}Ga_{1-X1}N$ layer 18 are grown thereon. After forming the InGaN layer 18 by a method similar to the formation of the InGaN layer 17 and lowering the temperature of the reactor at around room temperature, a substrate "W7" is taken out from the reactor 13.

Then, as shown in Part (b) of FIG. 6, a mask 19 for two-dimensional diffraction grating is formed on the InGaN layer 18 of the substrate "W7." By use of the mask 19, openings for the two-dimensional diffraction grating are formed in the InGaN layer 18. For example, the InGaN layer 18 is etched in a dry etcher 21 using the mask 19 to form a patterned InGaN layer 18a. The arrangement of openings 18b is included in the patterned InGaN layer 18a to which the two-dimensional pattern of the mask 19 is transferred. The side 18c of each opening 18b is made of InGaN.

As shown in Part (c) of FIG. 6, prior to the formation of the $Al_{X2}Ga_{1-X2}N$ layer, a dielectric layer 51 is formed without removing the mask 19. For example, evaporation can be used for this formation. A first portion 51a of the dielectric layer 51 covers a bottom surface 18d of the openings 18b, and a second portion 51b of the dielectric layer 51 covers the top surface of the mask 19. Then, as shown in Part (a) of FIG. 7, the mask 19 is removed, so that the second portion 51b on the mask 19 is also removed to produce a substrate "W8." The thickness of the dielectric layer 51 is smaller than the depth of the openings 18b. In the substrate "W8," the dielectric layer 51a is provided on the bottom surface 18d of the openings 18b, whereas the side surface 18c is made of InGaN. In an example, the depth of the openings 18b is, for example, preferably 20 nanometers or larger. If the openings are too shallow, the optical coupling between the photonic crystal and the active layer is made small, and sufficient optical feedback cannot be obtained. When the thickness of the dielectric layer 51a is too thick, the thick dielectric layer increases the average refractive index of the openings, whereby the performance of the photonic crystal is made deteriorated.

The substrate "W8" is loaded to the reactor 13, and the temperature of the reactor 13 is raised to the growth temperature "$T_G$." Then, as shown in Part (b) of FIG. 7, the gallium nitride-based semiconductor layer 23 is formed on the InGaN layer 18a. The gallium nitride-based semiconductor layer 23 is, for example, an n-type GaN layer or an AlGaN layer. The gallium nitride-based semiconductor layer 23 is laterally grown on the InGaN layer 18 over the openings, and covers the openings without filling them. Accordingly, voids 55 are formed by the combination of the openings 18b and the InGaN layer 18 that closes the openings 18b.

In this method, the bottom of the dielectric layer 51a and the side surface 18c of $Al_{X2}Ga_{1-X2}N$ prevent the growth in the openings 18b, thereby providing excellent shapes of the voids 55 made from the openings of the $In_{X1}Ga_{1-X1}N$ layer.

As material of the dielectric layer, it is possible to use, for example, at least one of a silicon oxide such as $SiO_2$, a silicon oxynitride such as SiON, a silicon nitride such as SiN, a zirconium oxide such as $ZrO_2$, a titanium oxide such as $TiO_2$, and a hafnium oxide such as $HfO_2$.

As can be understood from the above description, the active layer and other layers are grown thereon. In a method in which a photonic crystal structure is formed after forming the active layer (for example, Example 2), the above method of using the deposition of the dielectric material may be employed as well.

EXAMPLE 3

A violet two-dimensional photonic crystal (n-side) laser was fabricated. N-type $Al_{0.03}Ga_{0.97}N$ with a thickness of 2 micrometers (μm) and n-type $In_{0.02}Ga_{0.98}N$ with a thickness of 100 nanometers were sequentially grown on a (0001)-face n-type gallium nitride substrate. The epitaxial wafer was taken out from the reactor, and a mask having a pattern for forming a photonic crystal was formed in the following manner. Using an etching gas of $Cl_2$ and the resist mask, the n-type InGaN layer was partially removed to form an InGaN layer having an arrangement of openings corresponding to the pattern, thereby providing a substrate product. Then, before the resist mask is removed for lift-off, the substrate product was placed in an electron beam evaporation apparatus to form $SiO_2$ with a thickness of 10 nm on the bottom and the resist mask. The part of this $SiO_2$ film on the resist mask was removed along with the resist mask so that the $SiO_2$ film was left at the bottom of the voids, thereby forming a wafer product.

This wafer product was placed on the susceptor. After the substrate temperature was raised to the growth temperature, TMG, $NH_3$, and $SiH_4$ were supplied to the reactor at a substrate temperature of 1100 degrees Celsius and the chamber pressure of 30 kPa to grow an n-type GaN layer with a thickness of 200 nm, thereby forming the arrangement of voids formed by the n-type GaN layer and the depressions of the InGaN layer. Further, the remaining crystal growth was performed and electrodes were formed thereon, thereby providing a substrate product. Then, the substrate product was cut to form semiconductor dies, and each die had a size of 1×1 sq. millimeter and including the photonic crystal pattern of 300×300 sq. micrometer. When a pulsed current (with a frequency of 1 kHz and a pulse width of 500 nanoseconds) was applied to the violet two-dimensional photonic crystal laser at room temperature, lasing oscillation at a lasing wavelength of 405 nanometers (nm) was observed. The dielectric film in the Example 3 may be used in the structures of Examples 1 and 2 as well.

Figure 8:
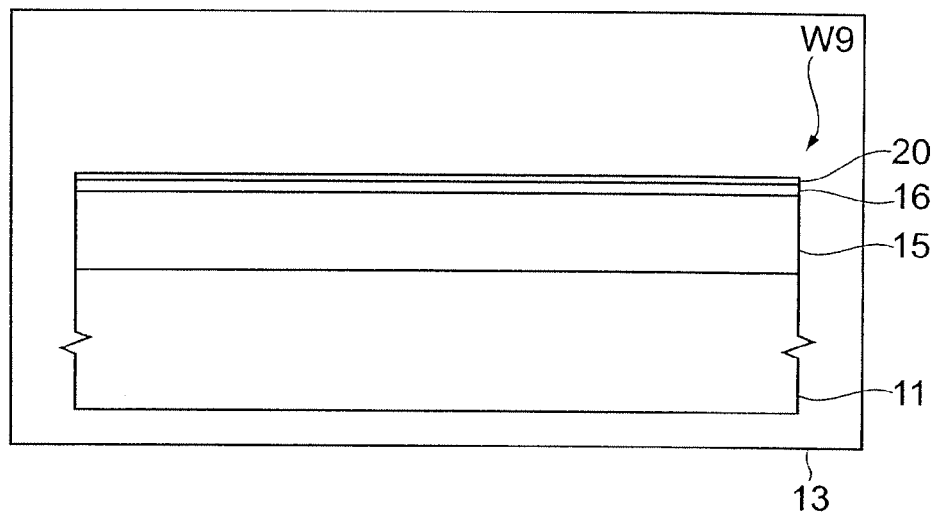
FIG. 8 is a diagram showing primary steps in a method of fabricating a semiconductor laser including a two-dimensional photonic crystal according to still another modified embodiment of the present invention.
Figure 8:
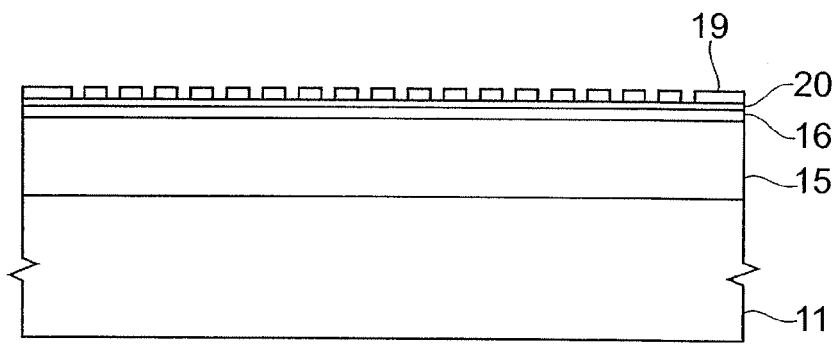
Figure 9:
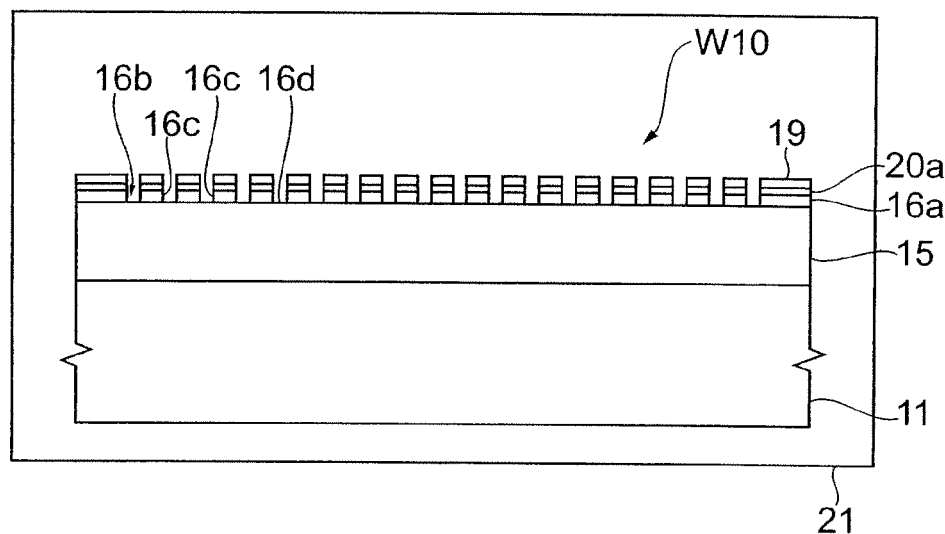
FIG. 9 is a diagram showing primary steps in a method of fabricating a semiconductor laser including a two-dimensional photonic crystal according to the above modified embodiment of the present invention.
Figure 9:
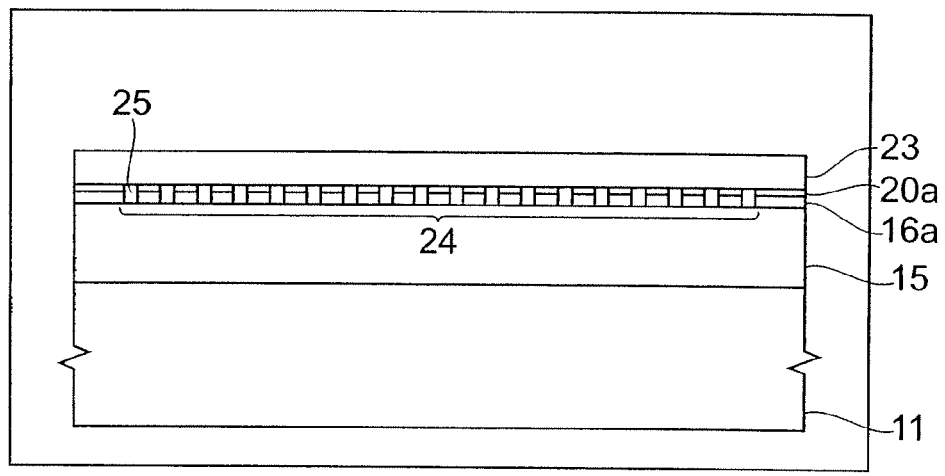

FIGS. 8 and 9 show primary steps of a method of fabricating a semiconductor laser including a two-dimensional photonic crystal according to another modified embodiment of the present invention. In this embodiment, prior to the formation of the openings in the InGaN layer, an additional gallium nitride-based semiconductor layer is grown and then a structure for the two-dimensional photonic crystal is formed. Similar to the above-described embodiments, a number of gallium nitride-based semiconductor layers for the semiconductor laser are formed, for example, by metal organic vapor phase epitaxy.

As shown in Part (a) of FIG. 8, the substrate 11, such as a GaN substrate, is loaded to the reactor 13. In the following description, steps for semiconductor laser on the substrate 11 of n-type conductivity are exemplified. After performing a thermal cleaning process of the primary surface 11a of the substrate 11, the n-type cladding layer 15 and an $In_{X1}Ga_{1-X1}N$ layer (hereinafter referred to as InGaN layer) 16 are grown thereon. After forming the InGaN layer 16 in a method similar to the formation of the InGaN layer 17, a cap layer 20 of a gallium nitride-based semiconductor is grown thereon. The thickness of the cap layer 20 is thinner than that of the InGaN layer 16. For example, an n-type GaN layer or an n-type AlGaN layer can be used as the cap layer 20. After this growth, the temperature of the reactor is lowered to a temperature near room temperature, and a substrate "W9" is taken out from the reactor 13.

Then, as shown in Part (b) of FIG. 8, a mask 19 for a two-dimensional diffraction grating is formed on the cap layer 20 of the substrate "W9." As shown in Part (a) of FIG. 9, openings for the two-dimensional diffraction grating are formed in the InGaN layer 16 and the cap layer 20 using the mask 19. For example, the InGaN layer 16 and the cap layer 20 are etched using the mask 19 in a dry etching apparatus 21 to form a patterned InGaN layer 16a and a patterned cap layer 20a, and openings 16b are formed therein. These layers 16a and 20a have the arrangement of openings 16b formed by the transferring of the two-dimensional pattern of the mask 19. The most of the surface 16c of each opening 16b primarily comprises InGaN. After the etching process, the mask 19 is removed to form a substrate product "W10." The substrate product "W10" includes the patterned InGaN layer 16a and the patterned cap layer 20a. In the present embodiment, a depth of each opening 16b is, for example, preferably 20 nanometers (nm) or larger. If the openings are too shallow, the optical coupling between the photonic crystal and the active layer is made small, whereby the semiconductor laser cannot be provided with the sufficient optical feedback. In the present embodiment, when the thickness of the cap layer 20 is too thick, the area of the InGaN exposed on the side surface of each opening is made small and thus its advantage is reduced.

The substrate "W10" is loaded to the reactor 13, and the temperature of the reactor 13 is raised to the growth temperature "$T_G$." Then, as shown in Part (b) of FIG. 9, the gallium nitride-based semiconductor layer 23 is formed on the InGaN layer 16a and the cap layer 20a. The gallium nitride-based semiconductor layer 23 is made of, for example, n-type GaN. The gallium nitride-based semiconductor layer 23 is laterally grown on the InGaN layer 20a over the openings without filling them, and covers the openings so as to close the openings. Voids 25 are formed by the combination of the above layer and the openings 16b. An AlGaN layer may be grown in place of the GaN layer. Thus, the gallium nitride-based semiconductor of the layer 23 is represented as $Al_{X2}Ga_{1-X2}N$.

In this method, after the substrate "W10" is loaded to the reactor 13, the temperature of the substrate "W10" is raised in the reactor toward the regrowth temperature "$T_G$." In this rise in temperature, the openings 16b are affected to restrict the growth of $Al_{X2}Ga_{1-X2}N$ and the occurrence of migration in the opening 16b, compared to the top surface of the patterned semiconductor layers 16a and 20a. As a result, this $Al_{X2}Ga_{1-X2}N$ is laterally grown on the InGaN layer 20a, and the $Al_{X2}Ga_{1-X2}N$ layer grow over the openings to cover the openings without filling them, thereby forming voids 25 by combining the openings 16b with the $Al_{X2}Ga_{1-X2}N$ layer that close the openings 16b. After the above steps, a two-dimensional diffraction grating 24 for the two-dimensional photonic crystal is formed.

As can be understood from the above description, an active layer and the remaining semiconductor layers are subsequently grown. In addition, the present method of using the additional GaN layer may be used as well in fabrication methods in which a photonic crystal structure is formed after growing the active layer. Moreover, a dielectric layer 51a may be grown on the bottom surface of the openings 16b.

EXAMPLE 4

A violet two-dimensional photonic crystal (n-side) laser was manufactured. The following layers were grown on a (0001)-face n-type gallium nitride substrate to form an epitaxial substrate: n-type $Al_{0.03}Ga_{0.97}N$ with a thickness of 2 micrometers (μm); n-type $In_{0.02}Ga_{0.98}N$ with a thickness of 100 nanometers; and n-type GaN with a thickness of 10 nanometers. Then, the epitaxial wafer was taken out from the reactor, and a mask for photonic crystal was formed in the following manner. The n-type InGaN layer and the n-type GaN layer were partially removed using an etching gas of $Cl_2$ and a resist mask having a pattern, thereby forming an arrangement of depressions in an InGaN layer and an n-type GaN layer, and this arrangement relates to the pattern of the resist mask. After removing the resist mask, the wafer was placed on the susceptor. The substrate temperature was raised to the growth temperature, and TMG, $NH_3$ and $SiH_4$ were supplied to the reactor at a substrate temperature of 1100 degrees Celsius and an chamber pressure of 30 kPa to form an n-type GaN layer with a thickness of 200 nm, thereby forming an arrangement of voids corresponding to the depressions of the InGaN layer. The subsequent crystal growth was performed, and electrodes were formed to form a substrate product. This substrate product is cut to form a number of semiconductor dies, each of which has a size of 1×1 sq. mm and includes the photonic crystal pattern of 300×300 sq. micrometer. When a pulsed current (with a frequency of 1 kHz and a pulse width of 500 nanoseconds) was applied to the violet two-dimensional photonic crystal laser at room temperature, lasing oscillation at the wavelength of 405 nm was observed. The cap film used in Example 4 may be used as well in Examples 1-3.

In the formation of the diffraction grating in the embodiments according to the present invention, the growth temperature of InGaN is lower than that of other gallium nitride-based semiconductors, such as GaN and AlGaN. Therefore, the damages that may be caused in the above processing or the like are left in the semiconductor. In the present embodiments, after etching processing such as dry etching, etching damages remain in the side surface and the bottom surface of the openings. Accordingly, after this processing, the crystal quality of the upper surface of InGaN differs from the crystal qualities of the side and bottom surfaces of the openings. By taking advantage of this difference, the selectivity in the crystal growth can be enhanced. Therefore, an excellent arrangement of voids is formed in photonic crystal structure by a method of fabricating a semiconductor laser.

With regard to the employment of the GaN cap layer and raise in temperature in a hydrogen atmosphere, if the outermost surface is made of InGaN, damages by etching are significantly affected in the temperature rise in hydrogen atmosphere to cause further damages. Thus, if the GaN cap layer is not formed thereon, the damages are introduced all over the surfaces. On the other hand, when a cap layer of GaN is employed, almost no damage is introduced to the GaN in the temperature rise even in the hydrogen atmosphere. Thus, it is possible to further increase the selectivity in crystal growth with respect to the side and bottom surfaces.

As described above, when forming the openings and the surface for subsequent regrowth in the $In_{X1}Ga_{1-X1}N$ layer, damages caused by the formation of the openings are still left in the surface of the openings, thereby reducing the surface migration and preventing the regrowth in the openings. In addition, by performing the subsequent crystal regrowth in the condition that promotes lateral growth, for example, a high temperature, a high growth rate and a low growth pressure, it is possible to promote the lateral growth in the top surface of $In_{X1}Ga_{1-X1}N$ and form voids corresponding to the openings of the $In_{X1}Ga_{1-X1}N$ layer. Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method of fabricating a semiconductor laser including a two-dimensional photonic crystal, the method comprising the steps of:
growing an $In_{X1}Ga_{1-X1}N$ (0<X1<1) layer on a gallium nitride-based semiconductor region in a reactor to form a substrate product;
after taking out, from the reactor, the substrate product including the $In_{X1}Ga_{1-X1}N$ layer, forming a plurality of openings for a two-dimensional diffraction grating of the two-dimensional photonic crystal in the $In_{X1}Ga_{1-X1}N$ layer to form a patterned $In_{X1}Ga_{1-X1}N$ layer; and
growing an $Al_{X2}Ga_{1-X2}N$ (0≦X2≦1) layer on the patterned $In_{X1}Ga_{1-X1}N$ layer so as to form voids from the openings.

2. The method according to claim 1, wherein a side and a bottom of each opening comprise InGaN.

3. The method according to claim 1, further comprising the step of, after growing the $In_{X1}Ga_{1-X1}N$ layer and prior to forming the plurality of the openings for the two-dimensional diffraction grating in the $In_{X1}Ga_{1-X1}N$ layer, growing a GaN layer on the $In_{X1}Ga_{1-X1}N$ layer, the substrate product including the GaN layer, the plurality of the openings being formed in the $In_{X1}Ga_{1-X1}N$ layer and the GaN layer.

4. The method according to claim 1, further comprising a step of, prior to the formation of the $Al_{X2}Ga_{1-X2}N$ layer, forming a dielectric layer, the dielectric layer covering bottom surfaces of the openings, the substrate product including the dielectric layer.

5. The method according to claim 4, wherein a top surface of the $In_{X1}Ga_{1-X1}N$ layer is in contact with the $Al_{X2}Ga_{1-X2}N$ layer.

6. The method according to claim 4, wherein
the dielectric layer includes at least one of a silicon oxide layer, a silicon oxynitride layer, a silicon nitride layer, a zirconium oxide layer, a titanium oxide layer, and a hafnium oxide layer.

7. The method according to claim 2, further comprising a step of, prior to the formation of the $Al_{X2}Ga_{1-X2}N$ layer, forming a dielectric layer, the dielectric layer covering bottom surfaces of the openings, the substrate product including the dielectric layer.

8. The method according to claim 7, wherein a top surface of the $In_{X1}Ga_{1-X1}N$ layer is in contact with the $Al_{X2}Ga_{1-X2}N$ layer.

9. The method according to claim 7, wherein the dielectric layer includes at least one of a silicon oxide layer, a silicon oxynitride layer, a silicon nitride layer, a zirconium oxide layer, a titanium oxide layer, and a hafnium oxide layer.

10. The method according to claim 3, further comprising a step of, prior to the formation of the $Al_{X2}Ga_{1-X2}N$ layer, forming a dielectric layer, the dielectric layer covering bottom surfaces of the openings, the substrate product including the dielectric layer.

11. The method according to claim 10, wherein a top surface of the $In_{X1}Ga_{1-X1}N$ layer is in contact with the $Al_{X2}Ga_{1-X2}N$ layer.

12. The method according to claim 10, wherein the dielectric layer includes at least one of a silicon oxide layer, a silicon oxynitride layer, a silicon nitride layer, a zirconium oxide layer, a titanium oxide layer, and a hafnium oxide layer.

13. The method according to claim 1, wherein the $Al_{X2}Ga_{1-X2}N$ layer is a GaN layer.

14. The method according to claim 1, further comprising the step of, after growing the $Al_{X2}Ga_{1-X2}N$ layer, growing an active layer.

15. The method according to claim 1, further comprising the step of, prior to growing the $In_{X1}Ga_{1-X1}N$ layer, growing an active layer.

16. The method according to claim 1, wherein a top surface of the $In_{X1}Ga_{1-X1}N$ layer is in contact with the $Al_{X2}Ga_{1-X2}N$ layer.

17. The method according to claim 1, wherein the $Al_{X2}Ga_{1-X2}N$ layer is grown on the $In_{X1}Ga_{1-X1}N$ layer such that the $Al_{X2}Ga_{1-X2}N$ layer closes the openings to form the voids.

18. The method according to claim 1, wherein the $In_{X1}Ga_{1-X1}N$ layer is covered with the $Al_{X2}Ga_{1-X2}N$ layer without filling the openings to form the voids.

19. The method according to claim 1, wherein the voids are arranged in a triangle grating.

20. The method according to claim 1, wherein the voids are arranged in a square grating.

* * * * *